(12) United States Patent
Jang

(10) Patent No.: US 6,265,319 B1
(45) Date of Patent: Jul. 24, 2001

(54) DUAL DAMASCENE METHOD EMPLOYING SPIN-ON POLYMER (SOP) ETCH STOP LAYER

(75) Inventor: Syun-Ming Jang, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/387,440

(22) Filed: Sep. 1, 1999

(51) Int. Cl.[7] .................................................. H01L 21/00
(52) U.S. Cl. ......................... 438/723; 438/738; 438/740; 438/743
(58) Field of Search ..................................... 438/692, 723, 438/724, 737, 738, 740, 743, 744; 216/38, 67, 79, 88

(56) References Cited

U.S. PATENT DOCUMENTS

| | | | |
|---|---|---|---|
| 5,371,047 | * 12/1994 | Greco et al. | 438/740 X |
| 5,578,523 | 11/1996 | Fiordalice et al. | 437/190 |
| 5,635,423 | 6/1997 | Huang et al. | 437/195 |
| 5,739,579 | 4/1998 | Chiang et al. | 257/635 |
| 5,760,480 | 6/1998 | You et al. | 257/783 |
| 5,767,582 | 6/1998 | Lee et al. | 257/753 |
| 5,817,572 | 10/1998 | Chiang et al. | 438/624 |
| 6,004,883 | * 12/1999 | Yu et al. | 438/723 X |

* cited by examiner

Primary Examiner—William Powell
(74) Attorney, Agent, or Firm—George O. Saile; Stephen B. Ackerman; Alek P. Szecsy

(57) ABSTRACT

A method for forming upon a substrate employed within a microelectronics fabrication a dual damascene stacked conductor interconnection layer. There is provided a substrate employed within a microelectronics fabrication wherein a series of conductor regions comprising a microelectronics conductor layer is formed within the substrate. There is then formed over the substrate a first dielectric layer. There is then formed over the first dielectric layer an intermediate low dielectric constant dielectric layer. There is then formed over the intermediate low dielectric constant dielectric layer a second dielectric layer. There is then formed over the second dielectric layer a first patterned photoresist etch mask layer, which is a contact via hole pattern. There is then etched the pattern of the first photoresist etch mask layer through the dielectric layers, employing a first anisotropic reactive etch process. There is then stripped the first patterned photoresist etch mask layer. There is then formed over the second dielectric layer a second patterned photoresist etch mask layer, which is an interconnection trench pattern aligned with the etched pattern of the first photoresist etch mask layer. There is then etched the pattern of the second photoresist etch mask layer into and through the second dielectric layer to the intermediate low dielectric constant dielectric layer which serves as an etch stop layer, thus forming a pattern of via contact holes and trenches to the underlying conductor regions of the substrate. There is then stripped the second patterned photoresist etch mask layer. There is then filled the etched patterns in the second dielectric layer, the intermediate low dielectric constant dielectric etch stop layer and the first dielectric layer with conductor material, so as to form a dual damascene stacked stacked conductor interconnection layer with reduced inter-level capacitance and low electrical resistance. The sequence of etching trench and contact via hole patterns may be reversed if desired to form the trench pattern first and then the via contact hole pattern aligned with the trench pattern, using the intermediate low dielectric constant dielectric layer as an etch stop layer.

21 Claims, 4 Drawing Sheets

DUAL DAMASCENE METHOD EMPLOYING SPIN-ON POLYMER (SOP) ETCH STOP LAYER

BACKGROUND OF THE INVENTION

1. Field of the Invention

The invention relates generally to the field of conductor interconnections within microelectronics fabrications. More particularly, the invention relates to the field of dual damascene metal interconnection layers employed within microelectronics fabrications.

2. Description of the Related Art

Microelectronics fabrications employ conductor lines to interconnect the electrical devices from which they are made. As device dimensions have become smaller, the requirements placed on interconnections have become more stringent. The number and complexity of the interconnections require multiple levels of wiring to interconnect the various devices, so that there has developed a need for multi-level interconnection wiring for microelectronics fabrications with increasing demands and constraints on materials and methods.

In order to decrease electrical resistance as dimensions and conductor cross-sections have shrunk, the art of microelectronics fabrication has resorted to conductors having the highest electrical conductivity available. In addition, there has been sought the reduction of resistance due to via contacts required between multiple levels of interconnection wiring. Finally, the need form more levels of interconnection wiring necessitates fabrication methods which maintain surface planarity as the number of layers required to be formed one on top of another has increased. The formation of interconnection lines by subtractive etching of a pattern in a conductor layer leaves raised pattern profiles which are often difficult to planarize with subsequently deposited dielectric layers, so that methods placing conductor lines within dielectric layer surfaces are under consideration.

Methods and materials providing high density interconnections with low electrical resistance have been developed which are generally satisfactory for meeting the stringent requirements of microelectronics fabrication. These include forming the interconnection patterns from copper metal because of its intrinsically high electrical conductivity. In addition, methods have been developed to form the interconnection lines inlaid within depressions or trenches formed within dielectric layers employing the method know as "damascene" for form a particular interconnection wiring level whose conductor layer surface is then approximately co-planar with the surface of the dielectric layer. When the inlaid conductor interconnection line and its associated via contact to another wiring level are formed in one integral structure, the method is known as a "dual damascene" stacked conductor interconnection layer. Such integral stacked conductor layers have reduced contact resistance. This method of dual damascene electrical interconnections is not without problems, however.

For example, the dual damascene method conventionally employs within the IMD layer upper and lower silicon containing dielectric layers separated by an intermediate dielectric layer of a different material which functions as an etch stop layer when forming an inlaid pattern by selective etching of the upper dielectric layer. When the upper and lower inter-level metal dielectric (IMD) layers are formed of silicon oxide dielectric material, the intermediate layer is commonly formed from a silicon nitride dielectric material as an inherently thin layer with a high dielectric constant. This may result in increased inter-level capacitance as well as fabrication and yield difficulties. In particular, the silicon nitride layer may not be sufficiently resistant towards the etching agent of the upper dielectric layer when formed of silicon oxide dielectric material during etching of the wiring trench pattern.

It is therefore towards the goal of forming within a microelectronics fabrication an inter-level metal dielectric (IMD) layer with improved dual damascene capability that the present invention is generally directed.

Various methods have been disclosed for forming damascene interconnection wiring inlaid within dielectric layers within microelectronics fabrication wherein there are multi-level interconnection levels and inter-level capacitance concerns.

For example, Fiordalice et al., U.S. Pat. No. 5,578,523, disclose a method for forming inlaid conductor layers with reduced dishing of the conductor layer surface during chemical mechanical polish planarization. The method employs a polishing assist layer formed of aluminum nitride over the conductor layer formed of aluminum, whereby the polishing rates of both materials are similar.

Further, Huang et al., in U.S. Pat. No. 5,635,423, disclose a dual damascene method enhanced trench/via profile. The method forms a via hole pattern in an upper inter-level metal dielectric (IMD) layer by a first etch method, followed by a trench pattern in the upper IMD layer and a via hole pattern in a lower IMD layer by a second etch method. Upper and lower IMD layers are formed of silicon oxide dielectric material, and the intermediate etch stop layer is formed of a silicon containing dielectric material or polysilicon material.

Further still, Chiang et al., in U.S. Pat. No. 5,739,579 and U.S. Pat No. 5,817,572, disclose methods for forming inlaid patterned conductors in contact with inlaid conductive vias formed through dielectric layers separated by an etch stop layer wherein there is improved process control. The dielectric layers are silicon oxide dielectric layers and the etch stop layer may be a silicon nitride dielectric layer. The method employs multiple application of the single damascene technique.

Still yet further, You et al., in U.S. Pat. No. 5,760,480, disclose a method for forming a low resistance-capacitance (RC) delay interconnection pattern without a barrier layer. The method employs copper metal interconnections and a bonding layer formed of low dielectric constant dielectric material which also serves as a barrier layer to obtain low electrical resistance R and low capacitance C.

Finally, Lee et al., in U.S. Pat. No. 5,767,582, disclose a method for forming interconnection conductor lines separated by less than one micron without electrical short circuits. The method employs a damascene process to form inlaid conductor lines after treating the insulator matrix layer with ammonium hydroxide and hydrogen peroxide to attenuate sensitivity to shorting.

Desirable in the art of microelectronics fabrication are additional methods for forming improved damascene interconnection patterns of inlaid conductive material.

It is towards these goals that the present invention is generally and specifically directed.

SUMMARY OF THE INVENTION

A first object of the present invention is to provide a method where there is formed within a substrate employed within a microelectronics fabrication a dual damascene interconnection layer with improved properties.

A second object of the present invention is to provide a method in accord with the first object of the present invention where an intermediate etch stop layer employed in the dual damascene fabrication is formed from a carbon containing low dielectric constant dielectric material.

A third object of the present invention is to provide a method in accord with the first object of the present invention and/or the second object of the present invention where the fabrication of the dual damascene interconnection layer is achievable due to sufficient etch selectivity between the dielectric layers and the intermediate etch stop layer.

A fourth object of the present invention is to provide a method in accord with the first object of the present invention, the second object of the present invention and the third object of the present invention where the method is readily commercially implemented.

In accord with the objects of the present invention, there is provided by the present invention a method for forming upon a substrate employed within a microelectronics fabrication a dual damascene interconnection pattern with improved properties. To practice the invention, there is first provided a substrate employed within a microelectronics fabrication wherein a series of conductor regions form a patterned microelectronics conductor layer within the substrate. There is then formed over the substrate a first dielectric layer. There is then formed over the first dielectric layer an intermediate low dielectric constant dielectric material. There is then formed over the intermediate low dielectric constant dielectric layer a second dielectric layer. There is then formed over the second dielectric layer a patterned etch mask. There is then etched through the dielectric layers a series of holes approximately the size of via contact holes through to the underlying conductor regions of the substrate. After stripping the first etch mask layer, there is then formed over the second dielectric layer a second patterned etch mask layer. There is then etched into the second dielectric layer while employing the second patterned etch mask an interconnection wiring trench pattern etched to the intermediate low dielectric constant dielectric layer which acts as an etch stop layer to form an etched wiring trench pattern aligned with the contact via hole pattern to the underlying patterned microelectronics conductor regions. After stripping the second photoresist etch mask, there is then filled the etched interconnection trench and via hole contact pattern with an inlaid conductor material to form the dual damascene stacked conductor interconnection layer with reduced inter-level capacitance and lowered electrical resistance.

The sequence of etching the via contact hole pattern and the trench wiring pattern may be reversed as desired to form the dual damascene trench and via hole patterns aligned to the underlying conductor regions which form the patterned microelectronics conductor layer formed within and upon the substrate.

The method of the present invention is of merit when employed within a substrate employed within a microelectronics fabrication selected from the group consisting of integrated circuit microelectronics fabrications, charge coupled device microelectronics fabrications, solar cell microelectronics fabrications, light emitting device microelectronics fabrications, ceramic substrate microelectronics fabrications and flat panel display microelectronics fabrications.

The method of the present invention employs methods and materials know in the art of microelectronics fabrication, but arranged in a novel sequence and degree of application. Therefore the present invention is readily commercially implemented.

BRIEF DESCRIPTION OF THE DRAWINGS

The objects, features and advantages of the present invention are understood within the context of the Description of the Preferred Embodiments, as set forth below. The Descriptions of the Preferred Embodiments are understood within the context of the accompanying drawings, which form a material part of this disclosure, wherein.

DESCRIPTION OF THE PREFERRED EMBODIMENTS

The present invention describes a method for forming upon a substrate within a microelectronics fabrication a dual damascene interconnection conductor layer with improved properties. The method achieves the result by employing an intermediate etch stop layer formed employing a carbon containing low dielectric constant dielectric material.

First Preferred Embodiment

Figure 1:
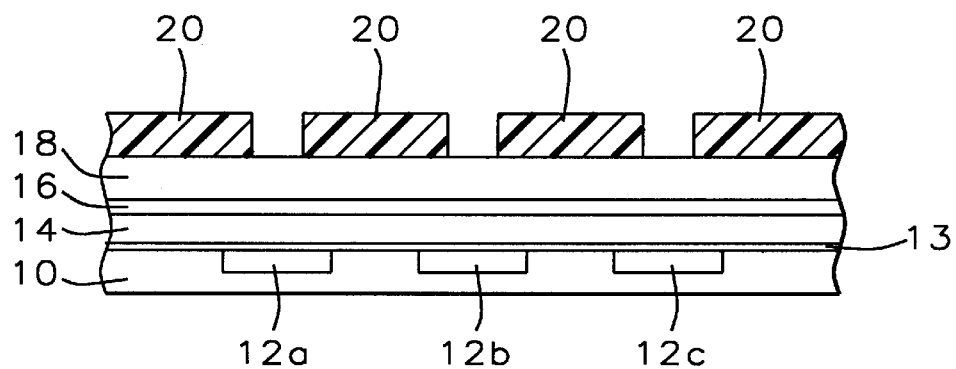
FIG. 1, FIG. 2, FIG. 3 and FIG. 4 are directed towards a general embodiment of the present invention which constitutes a first preferred embodiment of the present invention. Shown in FIG. 1 to FIG. 4 is a series of schematic cross-sectional diagrams illustrating the results of forming upon a substrate employed within a microelectronics fabrication a dual damascene interconnection wiring layer with improved properties.

Referring now more particularly to FIG. 1 to FIG. 4, there is shown a series of schematic cross-sectional diagrams illustrating the results of forming upon a substrate employed within a microelectronics fabrication in accord with a general method of the present invention which is a first preferred embodiment of the present invention a dual damascene interconnection conducting level with improved properties. FIG. 1 is a schematic cross-sectional diagram of a microelectronics fabrication at an early stage in its fabrication in accord with the first preferred embodiment of the present invention.

Shown in FIG. 1 is a substrate 10 within which is formed a series of microelectronics contact regions 12a, 12b and 12c comprising a patterned microelectronics conductor layer. Formed over the substrate 10 is an optional barrier layer 13, a first dielectric layer 14, an intermediate carbon containing dielectric layer 16 and a second dielectric layer 18. Formed over the second dielectric layer 18 is a first patterned etch mask 20.

With respect to the substrate 10 shown in FIG. 1, the substrate 10 may be the substrate itself employed within the microelectronics fabrication. Alternatively, the substrate 10 may be any of several microelectronics layers formed upon the substrate. The substrate 10 may be formed of materials selected from the group consisting of microelectronics conductor materials, microelectronics semiconductor materials and microelectronics dielectric materials. The substrate 10 may be a substrate employed within a microelectronics fabrication selected from the group consisting of integrated circuit microelectronics fabrications, charge coupled device microelectronics fabrications, solar cell microelectronics fabrications, light emitting diode microelectronics fabrications, ceramic substrate microelectronics fabrications and flat panel display microelectronics fabrications. Preferably the substrate 10 is a silicon semiconductor substrate.

With respect to the series of microelectronics contact regions 12a, 12b and 12c shown in FIG. 1, the microelectronics contact regions 12a, 12b and 12c may be formed from microelectronics materials including but not limited to metals, alloys, intermetallic compounds conducting compounds, semiconductors and highly doped semiconductor regions formed as patterned microelectronics layers employing methods known in the art of microelectronics fabrication including but not limited to thermal vacuum evaporation methods, electron beam evaporation methods, chemical vapor deposition (CVD) methods, physical vapor deposition (PVD) sputtering methods, reactive sputtering methods, ion implantation methods and electrochemical deposition methods. Contact regions 12a, 12b and 12c are formed within or upon the substrate employing methods and materials of photolithography as are known in the art of microelectronics fabrication. Preferably the series of contact regions 12a, 12b and 12c are formed of copper layers employing electrochemical plating methods upon copper seed layers formed over patterned tantalum nitride (TaN) barrier layers. Preferably the copper seed layers and tantalum nitride barrier layers are formed employing physical vapor deposition (PVD) sputtering methods.

With respect to the optional barrier dielectric layer 13 in FIG. 1, the optional dielectric barrier layer 13 may be formed employing a silicon nitride dielectric material. Preferably the optional silicon nitride dielectric barrier layer is formed employing chemical vapor deposition (CVD) according to the following process: (1) silane ($SiH_4$) gas at a flow rate of 270 standard cubic centimeters per minute (sccm); ammonia ($NH_3$) gas at a flow rate of about 120 standard cubic centimeters per minute (sccm); (2) power about 730 watts; (3) frequency of 13.56 mHz; and (4) total pressure of about 4.5 torr.

With respect to the first dielectric layer 14 shown in FIG. 1, the first dielectric layer may be formed over the optional silicon nitride barrier layer 13 which may be previously formed over the substrate 10. The first dielectric layer 14 is preferably a silicon containing glass dielectric layer formed employing plasma enhanced chemical vapor deposition (PECVD) method according to the following conditions: (1) silane gas at a flow rate of about 80 standard cubic centimeters per minute(sccm); nitrous oxide ($N_2O$) gas at a flow rate of 1800 standard cubic centimeters per minute (sccm); (2) temperature of about 400 degrees centigrade; (3) power of about 200 watts; (4) pressure of about 2.8 torr; and (5) frequency of 13.56 mHz. Preferably, the first dielectric layer 14 is formed to a thickness of about 7000 angstroms.

With respect to the intermediate carbon containing low dielectric constant dielectric layer 16 shown in FIG. 1, the intermediate carbon containing low dielectric constant dielectric layer 16 is formed from an organic polymer spin-on-polymer (SOP) low dielectric constant electric material. Preferably, the organic polymer spin-on-polymer (SOP) low dielectric constant dielectric material is a fluorinated poly (arylene) ether (FPAE) polymer selected from the group of commercially available fluorinated poly (arylene) ether (FPAE) polymers including but not limited to FLARE, available from Allied Signal Corp. 1349 Moffett Park Drive, Sunnyvale Calif. 94089, USA; alternately available as PAE from Shumacher Corporation, 1969 Palomar Oaks Way, Carlsbad, Calif. 92009 USA; and also alternatively available as SILK from Dow Chemical Corporation, 1712 Building, Midland, Mich. 48674 USA. Preferably the intermediate carbon containing dielectric layer 16 is formed to a thickness of about 1000 angstroms.

Alternatively, the intermediate carbon containing low dielectric constant dielectric layer 16 may be formed from fluorinated amorphous carbon low dielectric constant dielectric material employing chemical vapor deposition (CVD) according to the following process conditions: (1) gases $C_4F_8$ and $CH_4$ at flow rates of about 100 standard cubic centimeters per minute (sccm) each; (2) power about 350 watts; (3) temperature about 400 degrees centigrade; Preferably the intermediate carbon containing dielectric layer 16 formed of fluorinated amorphous carbon employing chemical vapor deposition (CVD) is formed to a thickness of about 1000 angstroms.

With respect to the second dielectric layer 18 shown in FIG. 1, the second dielectric layer is preferably a silicon containing glass dielectric formed analogous or equivalent to the first dielectric layer 14. Preferably the second dielectric layer 18 is formed to a thickness of about 7000 angstroms.

With respect to the first patterned etch mask 20 shown in FIG. 1, the first patterned etch mask is formed employing photolithographic methods and materials as are known in the art of microelectronics fabrication. Preferably the patterned etch mask layer 20 is a patterned photoresist etch mask layer.

Figure 2:
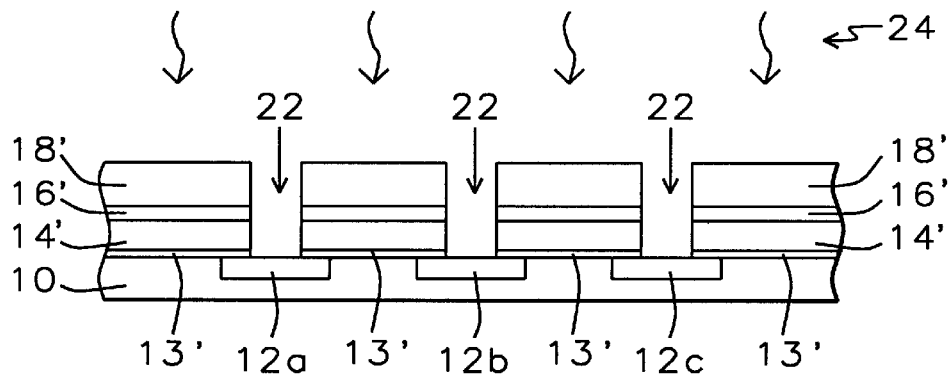

Referring now more particularly to FIG. 2, there is shown a schematic cross-sectional diagram illustrating the results of further processing of the microelectronics fabrication whose schematic cross-sectional diagram is shown in FIG. 1 in accord with the first preferred embodiment of the present invention. Shown in FIG. 2 is a microelectronics fabrication otherwise equivalent to the microelectronics fabrication shown in FIG. 1, but where there has been etched the pattern 22 of the mask 20 into the underlying dielectric layers 13', 14', 16' and 18' employing a first reactive etching process environment 24.

With respect to the etched pattern 22 shown in FIG. 2, the etched pattern 22 is approximately the pattern of via contact holes required as desired by design of the microelectronics fabrication for contact to underlying conductor regions 12a, 12b and 12c within the substrate 10.

With respect to the first reactive etching environment 24 shown in FIG. 2, the first reactive etching process 24 preferably employs an anisotropic etching method according to the following process conditions: (1a) silicon oxide layer etching: $CHF_3$ gas flow rate of about 50 standard cubic centimeters per minute (sccm), $CF_4$ glass flow rate of about 10 standard cubic centimeters per minute (sccm), and argon glass flow rate of about 100 standard cubic centimeters per minute (sccm); (2a) source power of about 1000 watts; (3a) bias power of about 50 watts; (4a) pressure of about 250 millitorr; (1b) optional silicon nitride barrier/etch stop layer etching: oxygen gas flow rate of about 15 standard cubic centimeters per minute (sccm); argon gas flow rate of about 15 standard cubic centimeters per minute (sccm); (2b) source power about 2000 watts; bias power of about 300 watts; (3b) pressure of about 10 millitorr; and (4b) temperature of about 100 degrees centigrade.

Figure 3:
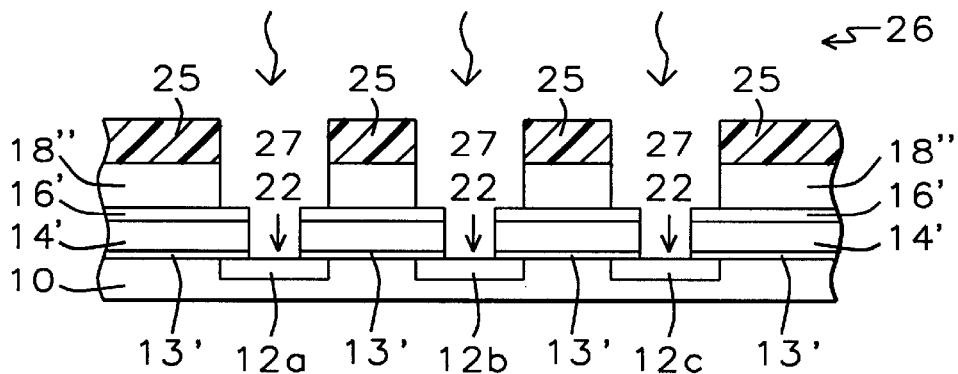

Referring now more particularly to FIG. 3, there is shown a schematic cross-sectional diagram illustrating the results of further processing of the microelectronics fabrication whose schematic cross-sectional diagram is shown in FIG. 2 in accord with the first preferred embodiment of the present invention. Shown in FIG. 3 is a microelectronics fabrication otherwise equivalent to the microelectronics fabrication shown in FIG. 2, but where there has been stripped the first patterned etch mask 20. There is then formed a second patterned etch mask 25 followed by a second reactive etch process 26 to transfer the wiring trench pattern of the second patterned etch mask 25 into the second dielectric layer 18". The intermediate carbon containing dielectric layer 16' serves as an etch stop layer to form the wiring trench pattern 27.

With respect to the second patterned etch mask 25 shown in FIG. 3, the second patterned etch mask 25 is formed analogous or equivalent to the first patterned etch mask pattern 20, wherein the second patterned etch mask pattern is the wiring trench pattern of the interconnection line pattern required as desired by design of the microelectronics fabrication.

With respect to the second reactive etch process 26 shown in FIG. 3, the second reactive etch process 26 transfers the pattern of the patterned etch mask 25 into the second dielectric layer 18" down to the intermediate dielectric layer 16', Preferably, the second reactive etch process is an anisotropic etch process employs the same process conditions as previously described for the first silicon oxide dielectric layer 14.

With respect to the trench pattern 27 and via contact hole pattern 22 etched into the respective second dielectric layer 18" and the intermediate dielectric layer 16' and first dielectric layer 14' shown in FIG. 3, the trench pattern 27 and the via contact hole pattern 22 conform to the desired pattern of the stacked conductor dual damascene interconnection conductor level to be fabricated.

Figure 4:
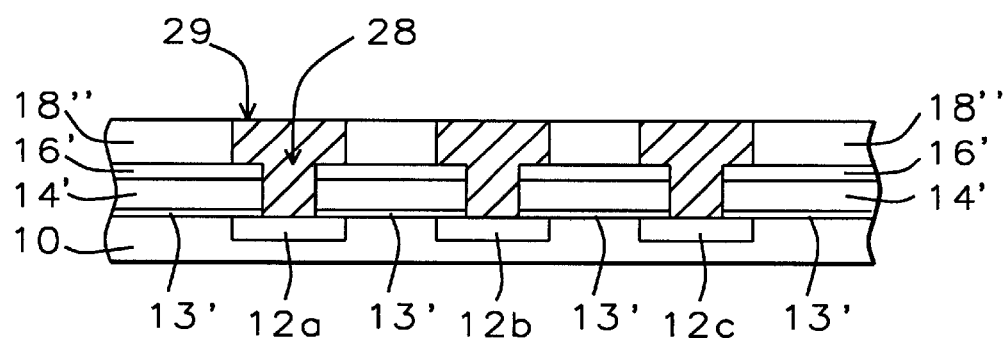

Referring now more particularly to FIG. 4, there is shown a schematic cross-sectional diagram illustrating the results of further processing of the microelectronics fabrication whose schematic cross-sectional diagram is shown in FIG. 3 in accord with the first preferred embodiment of the present invention. Shown in FIG. 4 is a microelectronics fabrication otherwise equivalent to the microelectronics fabrication shown in FIG. 3, but where there has been stripped the patterned etch mask 25 and where the trench pattern 27 and via contact hole pattern 22 have been filled with a conductor material 28 to form the stacked conductor dual damascene interconnection layer 29.

With respect to the conductor material 28 shown in FIG. 4, the conductor material 28 may be a microelectronics conductor material selected from the group including but not limited to copper, copper-aluminum alloys and tungsten formed employing methods including but not limited to electrochemical deposition, chemical vapor deposition, physical vapor deposition sputtering, and vacuum evaporation as are known in the art of microelectronics fabrication. The conductor material 28 is formed into a stacked conductor dual damascene interconnection layer 29 formed to a thickness to bring the top surface of the conductor stack to the same level as the top surface of the dielectric layer 18". Although not shown in FIG. 4, an optional surface planarization step may be employed to insure the final planarity of the top surface of the microelectronics fabrication.

The stacked conductor dual damascene interconnection layer 29 has formed an integral structure where the interconnection line and via contact layers meet, wherein there is only the inherent electrical resistivity of the conductor materials and no other contact resistance. Thus the dual damascene interconnection layer 29 is formed with a reduced electrical resistance for the total structure.

The etch selectivity of the carbon containing intermediate low dielectric constant dielectric layer 16 is desirably such that the etch rates of the silicon containing glass dielectric material employed in dielectric layers 14 and 18 should be higher than the etch rate of the intermediate dielectric layer 16 by at least the ratio of 5:1. The advantage of the present invention is to provide an etch selectivity ratio of 6:1.

The low dielectric constant of the intermediate carbon containing low dielectric constant dielectric layer 16 employed as the etch stop layer in the present invention provides a reduced inter-level capacitance for the complete inter-level metal dielectric (IMD) layer attained by the present invention.

The sequence of formation of the trench pattern and the via hole pattern by anisotropic etching of the second and first dielectric layers employing separate etch mask patterns may be reversed from the sequence described above. The trench pattern may be etched first in the second dielectric layer with the carbon containing dielectric layer acting as an etch stop layer, and after stripping the etch mask layer, the second etch mask pattern may be formed and employed to etch the via hole pattern into the etch stop layer and the first dielectric layer to the contact regions in the substrate.

Second Preferred Embodiment

Figure 5:
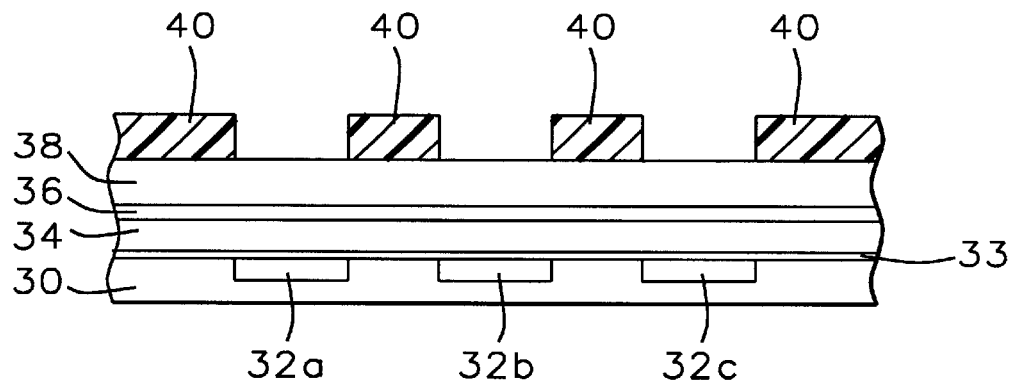
FIG. 5, FIG. 6, FIG. 7 and FIG. 8 are directed towards a more specific embodiment of the present invention which constitutes a second preferred embodiment of the present invention. Shown in FIG. 5 to FIG. 8 is a series of schematic cross-sectional drawings illustrating the results of forming upon a semiconductor substrate employed within an integrated circuit microelectronics fabrication a dual damascene interconnection wiring layer with improved properties.

Referring now more particularly to FIG. 5 to FIG. 8, there is shown a series of schematic cross-sectional diagrams illustrating the results of forming upon a semiconductor substrate employed within an integrated circuit microelectronics fabrication in accord with a more specific method of the present invention which constitutes a second preferred embodiment of the present invention a dual damascene interconnection wiring layer with improved properties. FIG. 5 is a schematic cross-sectional diagram of a microelectronics fabrication at an early stage in its fabrication in accord with the second preferred embodiment of the present invention.

Shown in FIG. 5 is a semiconductor substrate 30 within which is formed a series of conductor regions 32a, 32b and 32c which comprise a patterned conductor layer. Formed over the substrate 30 is a first dielectric layer 34, an intermediate carbon containing dielectric layer 36 and a second dielectric layer 38. Formed over the second dielectric layer 38 is a first patterned photoresist etch mask 40.

With respect to the semiconductor substrate 30 shown in FIG. 5, the semiconductor substrate 30 is a silicon semiconductor substrate which may be the substrate 30 itself employed within the integrated circuit microelectronics fabrication, or alternatively the substrate 30 may be one of several silicon semiconductor microelectronics layers formed upon the substrate 30.

With respect to the conductor regions 32a, 32b and 32c shown in FIG. 5, the conductor regions 32a, 32b and 32c are equivalent or analogous to the conductor regions 12a, 12b and 12c shown in FIG. 1 of the first preferred embodiment of the present invention.

With respect to the first and second dielectric layers 34 and 38 respectively shown in FIG. 5, the first and second dielectric layers 34 and 38 are equivalent or analogous to the first second dielectric layers 14 and 18 respectively shown in FIG. 1 of the first preferred embodiment of the present invention.

With respect to the intermediate carbon containing dielectric layer 36 is shown in FIG. 5, the intermediate carbon containing dielectric layer 36 is equivalent or analogous to the intermediate carbon containing dielectric layer 16 shown in FIG. 1 of the first preferred embodiment of the present invention.

With respect to the photoresist etch mask layer 40 shown in FIG. 5, the photoresist etch mask layer 40 is equivalent or analogous to the photoresist etch mask layer 20 shown in FIG. 1 of the first preferred embodiment of the present invention.

Figure 6:
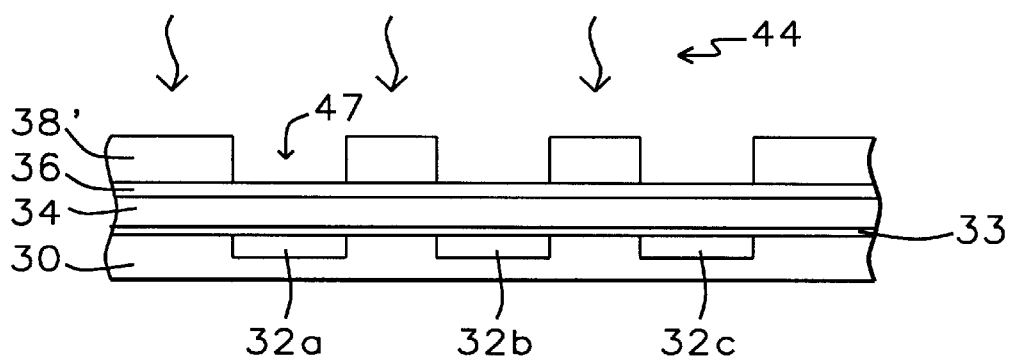

Referring now more particularly to FIG. 6, there is shown a schematic cross-sectional diagram illustrating the results of further processing of the integrated circuit microelectronics fabrication whose schematic cross-sectional diagram is shown in FIG. 5 in accord with the second preferred embodiment of the present invention. Shown in FIG. 6 is an integrated circuit microelectronics fabrication otherwise equivalent to the integrated circuit microelectronics fabrication shown in FIG. 5, but where there has been etched the pattern 47 of the photoresist mask layer 40 into the second dielectric layer 38' while employing a first reactive etching environment 44 followed by stripping of the residual photoresist etch mask layer 40.

With respect to the etched pattern 47 in the second dielectric layer 38' shown in FIG. 6, the etched pattern 47 is the trench pattern for the interconnection layer pattern to be formed.

With respect to the first reactive etching environment 44 shown in FIG. 6, the first etching environment is analogous or equivalent to the first etching environment shown in FIG. 2 of the first preferred embodiment of the present invention.

Figure 7:
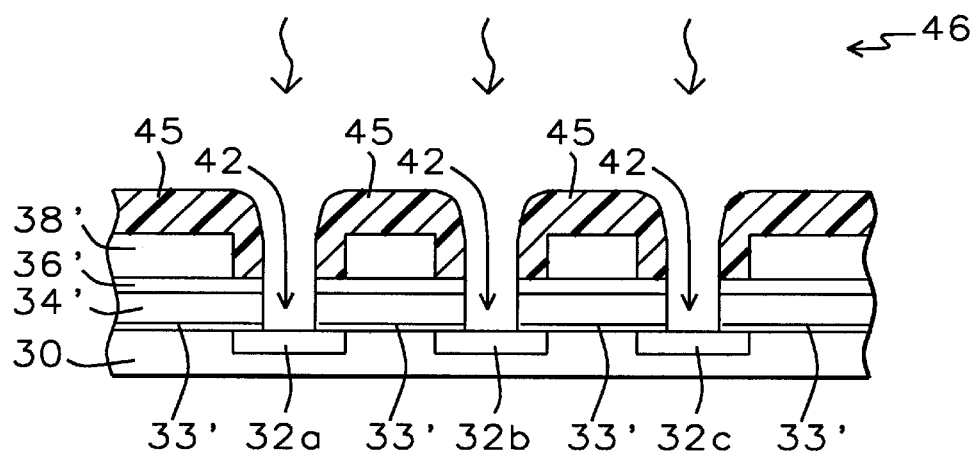

Referring now more particularly to FIG. 7, there is shown a schematic cross-sectional diagram illustrating the results of further processing of the integrated circuit microelectronics fabrication whose schematic cross-sectional diagram is shown in FIG. 6 in accord with the second preferred embodiment of the present invention. Shown in FIG. 7 is an integrated circuit microelectronics fabrication to otherwise equivalent to FIG. 6, but where there has been formed a second photoresist etch mask pattern 45 over the substrate 30, which pattern has been transferred into and through the intermediate carbon containing dielectric layer 36' and the first dielectric layer 34' by a second reactive etching environment 46 to form a via hole pattern 42 to the underlying conductor regions 32a, 32b and 32c within the substrate 30.

With respect to the second photoresist etch mask pattern 45 shown in FIG. 7, the second photoresist etch mask pattern 45 has been formed analogous or equivalent to the photoresist etch mask pattern 20 shown in FIG. 1 of the first preferred embodiment of the present invention, where the pattern is that of the via holes to the underlying conductor regions 32a, 32b and 32c within the substrate 30.

With respect to the second reactive etching environment 46 shown in FIG. 7, the second reactive etching environment 46 is analogous or equivalent to the reactive etching environment 24 shown in FIG. 2 of the first preferred embodiment of the present invention.

Figure 8:
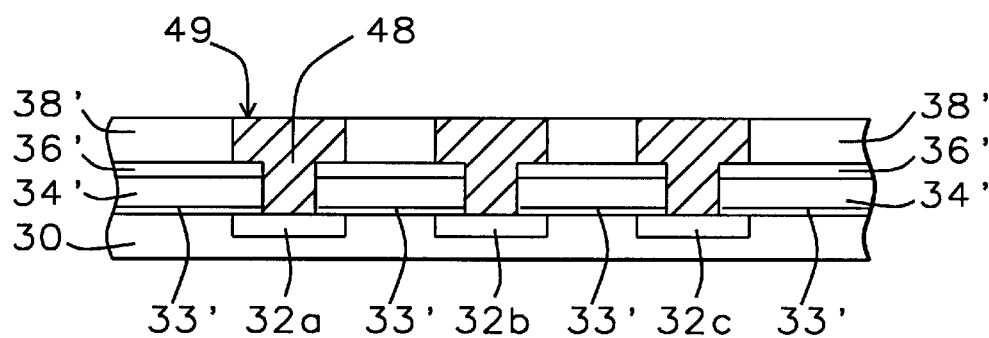

Referring now more particularly to FIG. 8, there is shown a schematic cross-sectional diagram illustrating the results of further processing of the integrated circuit microelectronics fabrication whose schematic cross-sectional diagram is shown in FIG. 7 in accord with the second preferred embodiment of the present invention. Shown in FIG. 8 is an integrated circuit microelectronics fabrication otherwise equivalent to FIG. 7, but where there has been stripped the second photoresist etch mask pattern 45 and where the etched via hole pattern 42 and the etched trench pattern 47 have been filled with a conductor material 48 to form the dual damascene interconnection wiring layer 49.

With respect to the conductor material 48 shown in FIG. 8, the conductor material 48 is analogous or equivalent to the conductor material 28 shown in FIG. 4 of the first preferred embodiment of the present invention.

Third Preferred Embodiment

Figure 9:
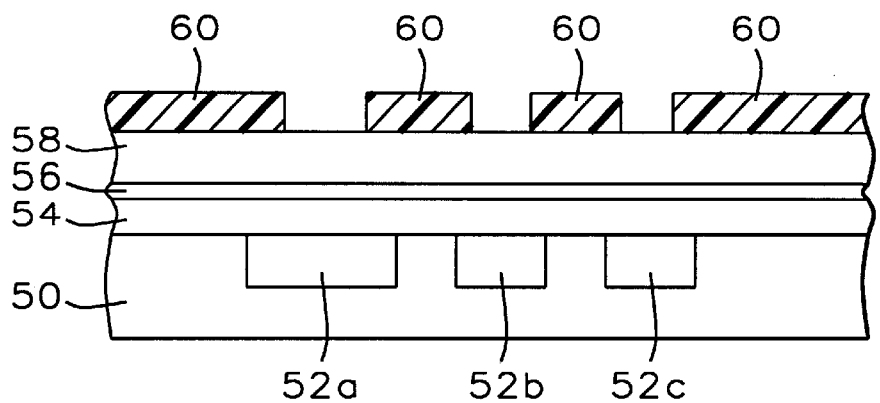
FIG. 9, FIG. 10, FIG. 11 and FIG. 12 are directed towards another more specific embodiment of the present invention which constitutes a third preferred embodiment of the present invention. Shown in FIG. 9 to FIG. 12 is a series of schematic cross-sectional diagrams illustrating the results of forming upon a semiconductor substrate employed within an integrated circuit microelectronics fabrication a dual damascene interconnection wiring layer with improved properties.

Referring now more particularly to FIG. 9 to FIG. 12, there is shown a series of schematic cross-sectional diagrams illustrating the results of forming upon a semiconductor substrate employed within an integrated circuit microelectronics fabrication in accord with another more specific method of the present which is a third preferred embodiment of the present invention a dual damascene interconnection wiring layer with improved properties. FIG. 9 is a schematic cross-sectional diagram of an integrated circuit microelectronics fabrication at an early stage in its fabrication in accord with the third preferred embodiment of the present invention.

Shown in FIG. 9 is a substrate 50 within which is formed a series of microelectronics conductor regions 52a, 52b and 52c comprising patterned microelectronics conductor layer. Formed over the substrate 50 is a first dielectric layer 54, an intermediate carbon containing dielectric layer 56 and a second dielectric layer 58. Formed over the second dielectric layer 58 is a photoresist etch mask layer 60.

With respect to the semiconductor substrate 50 and conductor regions 52a, 52b and 52c shown in FIG. 9, the semiconductor substrate 50 and conductor regions 52a, 52b and 52c are analogous or equivalent to the semiconductor substrate 30 and conductor regions 32a, 32b and 32c shown in FIG. 5 of the second preferred embodiment of the present invention.

With respect to the first dielectric layer 54, the intermediate carbon containing dielectric layer 56 and the second dielectric layer 58 shown in FIG. 9, the first dielectric layer 54, the intermediate carbon containing dielectric layer 56 and the second dielectric layer 58 are analogous or equivalent respectively to the first dielectric layer 34, the intermediate carbon containing dielectric layer 36 and the second dielectric layer 38 shown in FIG. 5 of the second preferred embodiment of the present invention.

With respect to the first photoresist etch mask layer 60 shown in FIG. 9, the first photoresist etch mask layer 60 is analogous or equivalent to the first photoresist etch mask layer 20 shown in FIG. 1 of the first preferred embodiment of the present invention.

Figure 10:
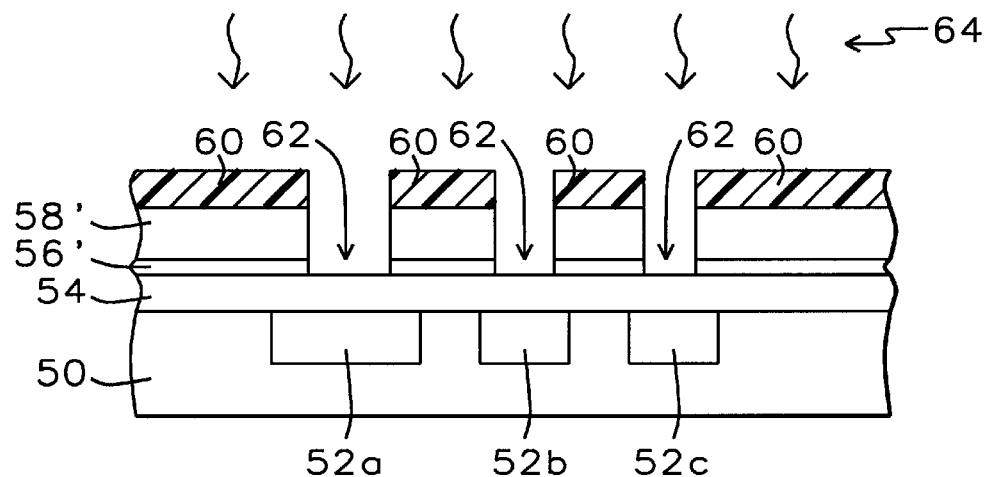

Referring not more particularly to FIG. 10, there is shown a schematic cross-sectional diagram illustrating the results of further processing of the integrated circuit microelectronics fabrication whose schematic cross-sectional diagram is shown in FIG. 9 in accord with the third preferred embodiment of the present invention. Shown in FIG. 10 is an integrated circuit microelectronics fabrication otherwise equivalent to the integrated circuit microelectronics fabrication shown in FIG. 9, but where there has been etched the pattern of the first photoresist etch mask 60 into and through the second dielectric layer 58' and the intermediate carbon containing dielectric layer 56' employing the first reactive etching environment 64, to form the via hole pattern 62 through the second dielectric layer 58' and the intermediate dielectric layer 56', followed by stripping of the first photoresist etch mask layer 60.

With respect to the etched via hole pattern 62 shown in FIG. 10, the etch via hole pattern is analogous to the via hole pattern 22 shown in FIG. 2 of the first preferred embodiment of the present invention, except that the via hole etching is completed only through the intermediate carbon containing dielectric layer 56' and is not etched to any significant degree into the first dielectric layer 54.

With respect to the first reactive etching environment 64 shown in FIG. 10, the first reactive etching environment 64 is equivalent or analogous to the first reactive etching environment 24 shown in FIG. 2 of the first preferred embodiment of the present invention.

Figure 11:
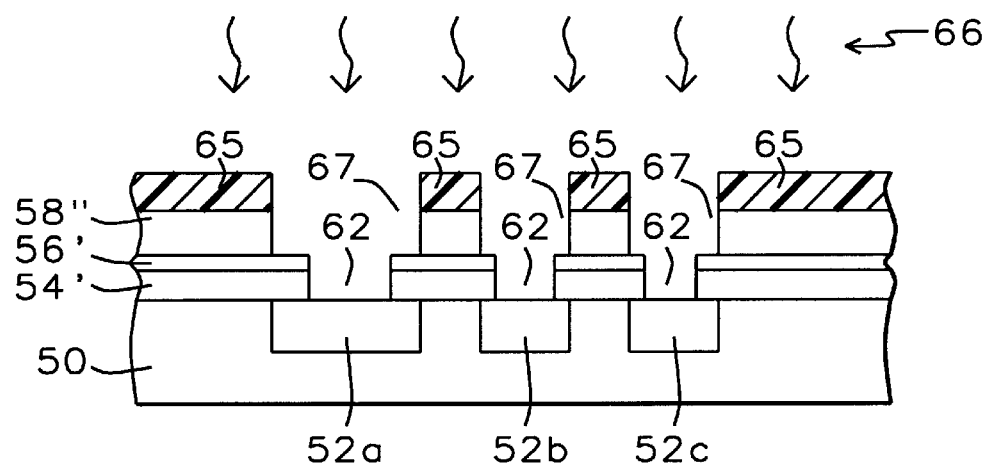

Referring now more particularly to FIG. 11, there is shown a schematic cross-sectional diagram illustrating the results of further processing of the integrated circuit microelectronics fabrication whose schematic cross-sectional diagram is shown in FIG. 10 in accord with the third preferred embodiment of the present invention. Shown in FIG. 11 is an integrated circuit microelectronics fabrication otherwise equivalent to the integrated circuit microelectronics fabrication shown in FIG. 10, but where there has been formed a second photoresist etch mask pattern 65 through which there has been etched a trench pattern 67 into the second dielectric layer 58" employing the intermediate carbon containing dielectric layer 56' as an etch stop layer, while simultaneously extending the etched via hole pattern 62 through the first dielectric layer 54' to the underlying conductor regions 52a, 52b and 52c, employing a second reactive etch environment 68.

With respect to a second photoresist etch mask layer 65 shown in FIG. 11, the second photoresist etch mask layer 65 is analogous or equivalent to the second photoresist etch make layer 25 shown in FIG. 3 of the first preferred embodiment of the present invention. The corresponding trench pattern 67 etched in the second dielectric layer 58" is analogous to the trench pattern 27 shown in FIG. 3 of the first preferred embodiment of the present invention. The via hole pattern 62 shown in FIG. 11 etched through the dielectric layers 54', 56' and 58" is analogous to the etched via hole pattern 22 shown in FIG. 3 of the first preferred embodiment of the present invention.

With respect to the second reactive etching environment 66 shown in FIG. 11, the second reactive etching environment 66 is analogous or equivalent to the second reactive etching environment 26 shown in FIG. 3 of the first preferred embodiment of the present invention.

Figure 12:
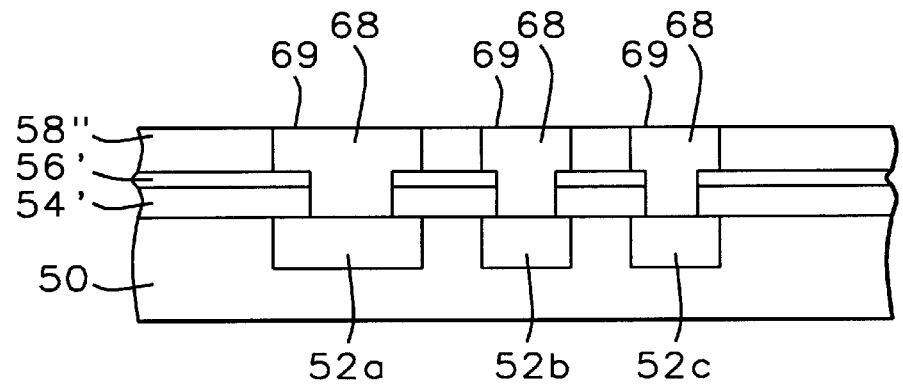

Referring now more particularly to FIG. 12, there is shown a schematic cross-sectional diagram illustrating the results of further processing of the integrated circuit microelectronics fabrication whose schematic cross-sectional diagram is shown in FIG. 11 in accord with the method of the third preferred embodiment of the present invention. Shown in FIG. 12 is an integrated circuit microelectronics fabrication otherwise equivalent to the integrated circuit microelectronics fabrication shown in FIG. 11, but where the second photoresist etch mask layer 65 has been stripped and the etched trench and via hole patterns filled with a conductor material 68 to form the dual damascene interconnection wiring layer 69.

With respect to the conductor material 68 filling the trench pattern 67 and via hole pattern 62 forming the dual damascene interconnection layer 69 shown in FIG. 12, the conductor material 68 is analogous or equivalent to the conductor material 48 shown in FIG. 8 of the second preferred embodied of the present invention, and the dual damascene interconnection wiring layer 69 is analogous or equivalent to the dual damascene interconnection wiring layer 48 shown in FIG. 8 of the second preferred embodiment of the present invention.

As is understood by a person skilled in the art, the various preferred embodiments of the present invention are illustrative of the present invention rather than limiting of the present invention. Modifications and revisions may be made to methods, material, structures and dimensions through which are formed microelectronics fabrications in accord with the preferred embodiment of the present invention without departing from the spirit and scope of the present invention, which are detailed in the appended claims.

What is claimed is:

1. A method for forming upon a substrate employed within a microelectronics fabrication a dual damascene structure comprising:

providing a substrate having contact regions formed thereon;

forming over the substrate a first dielectric layer;

forming upon the first dielectric layer an intermediate carbon containing low dielectric constant dielectric layer;

forming upon the intermediate carbon containing low dielectric constant dielectric layer a second dielectric layer;

forming over the second dielectric layer a first patterned photoresist etching mask layer which defines contact via holes;

etching through the first patterned photoresist mask layer employing a first anisotropic reactive etch process and transferring the pattern thereof into and through the second dielectric layer, intermediate carbon containing low dielectric constant dielectric layer and first dielectric layer;

stripping the first patterned photoresist etch mask layer;

forming over the substrate a second patterned photoresist etch mask layer defining a trench pattern;

etching through the second patterned photoresist etch mask layer employing a second anisotropic reactive etch process and transferring the trench pattern thereof into the second dielectric layer, using the intermediate carbon containing low dielectric constant dielectric layer as an etch stop layer, thus forming an etched contact via hole and trench pattern; and stripping the second patterned photoresist etch mask layer.

2. The method of claim 1 wherein there is further filled the etched patterned via contact hole and trench regions within the dielectric layers with a conductor material to form a stacked conductor dual damascene interconnection layer.

3. The method of claim 1 wherein the substrate is employed within a microelectronics fabrication selected form a group consisting of:

integrated circuit microelectronics fabrications;

charge coupled device microelectronics fabrications;

solar cell microelectronics fabrication;

light emitting diode microelectronics fabrications;

ceramic substrate microelectronics fabrications; and flat panel display microelectronics fabrications.

4. The method of claim 2 wherein the etched via contact hole and trench pattern is filled with material selected from the group of conductor materials consisting of:

microelectronics metallic materials;

microelectronics alloy materials;

microelectronics conductive compound materials; and microelectronics semiconductor materials.

5. The method of claim 1 wherein the first and second dielectric layers are silicon containing glass dielectric layers formed employing methods consisting of:

plasma enhanced chemical vapor deposition (PECVD);

sub-atmospheric pressure chemical vapor deposition (SACVD);

high density plasma chemical vapor deposition (HDP-CVD).

6. The method of claim 1 wherein the intermediate carbon containing low dielectric constant dielectric material which is used as an etch stop layer is formed from low dielectric constant dielectric material chosen from the group consisting of:

fluorinated poly(arylene)ether organic polymer spin-on-polymer (SOP) low dielectric constant dielectric materials; and fluorinated amorphous carbon low dielectric constant dielectric materials.

7. The method of claim 1 where in the first anisotropic reactive etch process is a plasma process employing trifluoromethane ($CHF_3$), tetrafluoromethane ($CF_4$) and argon gases.

8. The method of claim 1 wherein the second anisotropic reactive etch process is a plasma process employing trifluoromethane ($CHF_3$), tetrafluoromethane ($CF_4$) and argon gases.

9. The method of claim 4 wherein the conductor material forming the dual damascene interconnection stacked conductor layer is selected from the group consisting of:

copper metal;

aluminum-copper alloys; and tungsten.

10. The method of claim 2 further comprising:

planarizing the top surface of the dual damascene interconnection stacked conductor layer to be co-planar with the top surface of the second dielectric layer;

etching through the second patterned photoresist etch mask layer, the intermediate carbon containing low dielectric constant dielectric etch stop layer and the first silicon containing glass dielectric layer to the contact regions employing a second anisotropic reactive etch process;

stripping the second patterned photoresist etch mask layer; and filling the etched pattern in the second silicon containing glass dielectric layer, the intermediate carbon containing low dielectric constant dielectric etch stop layer and the first silicon containing glass dielectric layer with copper metal to form a dual damascene stacked conductor interconnection layer.

11. A method for forming upon a substrate employed within a microelectronics fabrication a dual damascene structure comprising:

providing a substrate having contact regions formed therein;

forming over the substrate an optional silicon nitride dielectric barrier layer;

forming over the substrate a first dielectric layer;

forming upon the first dielectric layer an intermediate carbon containing low dielectric constant dielectric layer;

forming upon the intermediate carbon containing low dielectric constant dielectric layer a second dielectric layer;

forming over the second dielectric layer a patterned etch mask layer defining a trench pattern;

etching through the patterned etch mask layer employing a first anisotropic etch process and transferring the trench pattern thereof into and through the second dielectric layer, using the intermediate carbon containing dielectric layer as an etch stop layer;

stripping the first patterned etch mask layer;

forming a second patterned etch mask layer on the substrate defining a pattern of via contact holes congruent with the trench pattern;

etching through the second patterned etch mask layer employing a second anisotropic etching process and transferring the via hole pattern thereof through the intermediate carbon containing dielectric layer and the first dielectric layer; and stripping the second patterned etch mask layer.

12. The method of claim 11 further comprising filling the etched trench and via hole features with a conductor material to form a dual damascene interconnection stacked conductor layer structure.

13. The method of claim 11 wherein the carbon containing low dielectric constant dielectric layer is formed employing materials selected from the group consisting of:

fluorinated poly(arylene) ether organic polymer spin-on-polymer (SOP) low dielectric constant dielectric materials; and fluorinated amorphous carbon low dielectric constant dielectric materials.

14. A method for forming within a semiconductor substrate employed within an integrated circuit microelectronics fabrication a dual damascene stacked conductor interconnection layer comprising:

providing a semiconductor substrate having contact regions formed thereon;

forming over the substrate an optional silicon nitride dielectric barrier layer;

forming over the semiconductor substrate a first silicon containing glass dielectric layer employing high density plasma chemical vapor deposition (HDP-CVD);

forming upon the first silicon containing glass dielectric layer an intermediate carbon containing low dielectric contact dielectric etch stop layer;

forming upon the intermediate carbon containing low dielectric constant dielectric etch stop layer a second silicon containing glass dielectric layer employing high density plasma chemical vapor deposition (HDP-CVD);

forming over the second silicon containing glass dielectric layer a first patterned photoresist etch mask;

etching the pattern of the patterned photoresist etch mask through the first silicon containing glass dielectric layer using the intermediate carbon containing low dielectric constant dielectric layer as an etch stop layer employing a first reactive anisotropic etch process;

stripping the first patterned photoresist etch mask and forming a second patterned photoresist etch mask;

etching the intermediate carbon containing low dielectric constant dielectric layer and the first dielectric layer through the second photoresist etch mask layer employing a second anistrophic reactive etching environment;

stripping the second patterned photoresist etch mask; and filling the etched patterns in the second silicon containing glass dielectric layer, the intermediate carbon containing low dielectric constant dielectric etch stop layer and the first silicon containing glass dielectric layer with copper metal to form a stacked conductor dual damascene interconnection layer with low electrical resistance and with reduced inter-level capacitance.

15. The method of claim 14 wherein the semiconductor substrate is a silicon semiconductor substrate.

16. The method of claim 14 wherein the semiconductor substrate is employed within a microelectronics fabrication selected from the group consisting of:

integrated circuit microelectronics fabrication;

charge coupled device microelectronics fabrication;

solar cell microelectronics fabrication; and light emitting diode microelectronics fabrication.

17. The method of claim 14 where in the intermediate carbon containing low dielectric constant dielectric etch stop layer is formed from organic polymer spin-on-polymer (SOP) low dielectric constant dielectric materials.

18. The method of claim 14 wherein the low dielectric constant spin-on-polymer (SOP) dielectric material is a fluorinated poly (arylene) ether organic polymer.

19. A method for forming within a semiconductor substrate employed within an integrated circuit microelectronics fabrication a dual damascene stacked conductor interconnection wiring layer comprising:

providing a semiconductor substrate having formed contact regions thereon;

forming over the semiconductor substrate a first silicon containing glass dielectric layer employing high density plasma chemical vapor deposition (HDP-CVD);

forming upon the first silicon containing glass dielectric layer an intermediate low dielectric constant dielectric layer employing low dielectric constant spin-on-polymer (SOP) dielectric materials;

forming upon the intermediate low dielectric constant dielectric layer a second silicon containing dielectric glass layer employing high density plasma chemical vapor deposition (HDP-CVD);

forming upon the second silicon containing dielectric glass layer a first patterned photoresist etch mask layer;

etching the pattern of the first photoresist etch mask layer into and through the second silicon containing glass dielectric layer and the intermediate low dielectric constant dielectric layer;

stripping the first photoresist etch mask layer;

forming a second patterned photoresist etch mask layer aligned with the etched pattern in the first silicon containing glass dielectric layer and the intermediate low dielectric constant dielectric layer;

etching the pattern of the second photoresist etch mask layer through the second silicon containing dielectric glass layer using the intermediate low dielectric layer as an etch stop layer, while simultaneously etching further the first etched pattern through the first silicon containing dielectric glass layer to the contact regions on the substrate, employing a second anisotropic reactive etching environment;

stripping the second photoresist etch mask layer; and filling the etched pattern features with a copper conductor to form a stacked conductor dual damascene interconnection wiring layer with reduced inter-level capacitance and lowered electrical resistance.

20. The method of claim 19 wherein the semiconductor substrate is a silicon semiconductor substrate.

21. The method of claim 19 wherein the low dielectric constant spin-on-polymer (SOP) dielectric material is a fluorinated poly (arylene) ether organic polymer dielectric material.

* * * * *